(12) United States Patent
Sato et al.

(10) Patent No.: US 7,875,856 B2
(45) Date of Patent: Jan. 25, 2011

(54) RADIATION DETECTOR

(75) Inventors: Kenji Sato, Kyoto (JP); Junichi Suzuki, Kyoto (JP); Koji Watadani, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 129 days.

(21) Appl. No.: 12/280,306

(22) PCT Filed: Feb. 23, 2006

(86) PCT No.: PCT/JP2006/303275

§ 371 (c)(1),
(2), (4) Date: Aug. 21, 2008

(87) PCT Pub. No.: WO2007/096967

PCT Pub. Date: Aug. 30, 2007

(65) Prior Publication Data

US 2009/0050813 A1    Feb. 26, 2009

(51) Int. Cl.
*G01T 1/24* (2006.01)
(52) U.S. Cl. .................................. 250/370.11
(58) Field of Classification Search ............ 250/370.08, 250/370.09, 370.01, 370.11, 370.12, 370.13
See application file for complete search history.

(56) References Cited

U.S. PATENT DOCUMENTS

| | | | | |
|---|---|---|---|---|
| 5,450,813 | A * | 9/1995 | Nishimura et al. | 117/84 |
| 6,512,233 | B1 * | 1/2003 | Sato et al. | 250/370.13 |
| 6,864,484 | B1 * | 3/2005 | Zur | 250/370.09 |
| 2002/0148949 | A1 * | 10/2002 | Sato et al. | 250/214.1 |
| 2003/0127598 | A1 | 7/2003 | Sato et al. | |
| 2005/0051731 | A1 | 3/2005 | Sato et al. | |

FOREIGN PATENT DOCUMENTS

| | | |
|---|---|---|
| JP | 1-132172 A | 5/1989 |
| JP | 09-082932 A | 3/1997 |
| JP | 2001-298172 A | 10/2001 |
| JP | 2003-133575 A | 5/2003 |
| JP | 2005-086059 A | 3/2005 |
| JP | 2005-286183 A | 10/2005 |

OTHER PUBLICATIONS

Chinese Office Action for the Application No. 2006800533796 dated Aug. 14, 2009.
International Search Report for the Application No. PCT/JP2006/303275 mailed Mar. 28, 2006.

* cited by examiner

*Primary Examiner*—David P Porta
*Assistant Examiner*—David S Baker
(74) *Attorney, Agent, or Firm*—Cheng Law Group, PLLC

(57) ABSTRACT

In a radiation detector according to this invention, a portion of a semiconductor, located in a connection of a common electrode to a lead wire, is dented in a recess form from other portions of a semiconductor, in a range short of a radiation detection effective area. An insulating seat is disposed to fill the portion located in the connection. The common electrode is formed to cover at least part of the seat. The lead wire is connected to a portion of the incidence surface of the common electrode located on the seat. Thus, the detector can avoid performance degradation resulting from connection of the lead wire to the common electrode, and avoid problems of heat deformation stress and radiation attenuation.

15 Claims, 7 Drawing Sheets

RADIATION DETECTOR

TECHNICAL FIELD

This invention relates to radiation detectors having a radiation sensitive semiconductor for generating electric charges upon incidence of radiation, for use in the medical, industrial, nuclear and other fields.

BACKGROUND ART

Radiation (e.g. X-ray) detectors include an "indirect conversion type" detector which once generates light upon incidence of radiation (e.g. X rays) and generates electric charges from the light, thus detecting the radiation by converting the radiation indirectly into the electric charges, and a "direct conversion type" detector which generates electric charges upon incidence of radiation, thus detecting the radiation by converting the radiation directly into the electric charges. The electric charges are generated by a radiation sensitive semiconductor.

As shown in FIG. 10, a direct conversion type radiation detector has an active matrix substrate 51, a radiation sensitive semiconductor 52 for generating electric charges upon incidence of radiation, and a common electrode 53 for bias voltage application. The active matrix substrate 51 has a plurality of collecting electrodes (not shown) formed on a radiation incidence surface thereof, with an electric circuit (not shown) arranged for storing and reading electric charges collected by the respective collecting electrodes. The respective collecting electrodes are set in a two-dimensional matrix arrangement inside a radiation detection effective area SA.

The semiconductor 52 is laid on the incidence surfaces of the collecting electrodes formed on the active matrix substrate 51, and the common electrode 53 is formed and laid planarly on the incidence surface of the semiconductor 52. A lead wire 54 for bias voltage supply is connected to the incidence surface of the common electrode 53.

In time of radiation detection by the radiation detector, a bias voltage from a bias voltage source (not shown) is applied to the common electrode 53 for bias voltage application via the lead wire 54 for bias voltage supply. With the bias voltage applied, electric charges are generated by the radiation sensitive semiconductor 52 upon incidence of the radiation. The generated electric charges are first collected by the collecting electrodes. The electric charges collected by the collecting electrodes are fetched as radiation detection signals from the respective collecting electrodes by the storing and reading electric circuit including capacitors, switching elements, electric wires and so on.

Each of the collecting electrodes in the two-dimensional matrix arrangement corresponds to an electrode (pixel electrode) corresponding to each pixel in a radiographic image. By fetching radiation detection signals, it becomes possible to create a radiographic image according to a two-dimensional intensity distribution of the radiation projected to the radiation detection effective area SA.

However, the conventional radiation detector shown in FIG. 10 has a problem of performance degradation resulting from the lead wire 54 being connected to the common electrode 53. That is, since a hard metal wire such as copper wire is used for the lead wire 54 for bias voltage supply, damage occurs to the radiation sensitive semiconductor 52 when the lead wire 54 is connected to the common electrode 53, thereby causing performance degradation such as a voltage resisting defect.

Particularly where the semiconductor 52 is amorphous selenium or a non-selenic polycrystalline semiconductor such as CdTe, CdZnTe, $PbI_2$, $HgI_2$ or TlBr, the radiation sensitive semiconductor 52 of large area and thickness may easily be formed by vacuum deposition. However, such amorphous selenium and non-selenic polycrystalline semiconductor are relatively soft and vulnerable to damage.

In order to avoid the performance degradation resulting from the lead wire 54 being connecting to the common electrode 53, Inventors have proposed an invention as shown in FIG. 11 (see Patent Document 1, for example). As shown in FIG. 11 (corresponding to FIG. 2 of Patent Document 1), an insulating seat 55 is disposed on the incidence surface of the semiconductor 52 outside the radiation detection effective area SA. A common electrode 53 is formed to cover at least part of the seat 55, and a lead wire 54 is connected to a portion of the incidence surface of the common electrode 53 located on the seat 55.

With such seat 55 disposed, the seat 55 can reduce a shock occurring when the lead wire 54 is connected to the common electrode 53. This consequently prevents damage to the radiation sensitive semiconductor that leads to a voltage resisting defect, and avoids performance degradation such as voltage resisting defect. The seat 55 is disposed outside the radiation detection effective area SA, thereby preventing impairment of the radiation detecting function.

As shown in FIG. 12, there is a technique wherein a resin layer 57 of curable synthetic resin is formed to fix an auxiliary plate 56 so that the insulating auxiliary plate 56 having a thermal expansion coefficient nearly equal to that of an active matrix substrate 51 covers a semiconductor 52 and a common electrode 53. Further, the resin layer 57 is formed thicker outside a radiation detection effective area SA including a connection of the common electrode 53 to a lead wire 54 than inside the radiation detection effective area SA (see Patent Document 2, for example). With the resin layer 57 formed thinner inside the radiation detection effective area SA, stress on the semiconductor 52 due to the resin layer 57 can be reduced. With the resin layer 57 formed thicker outside the radiation detection effective area SA, performance degradation in creeping discharge prevention can be reduced.

[Patent Document 1]

Unexamined Patent Publication No. 2005-86059 (pages 1, 2, 4 to 12, FIGS. 1, 2, 6 to 9)

[Patent Document 2]

Unexamined Patent Publication No. 2005-286183 (pages 1 to 10, FIG. 1)

DISCLOSURE OF THE INVENTION

Problems to be Solved by the Invention

However, when the insulating seat is disposed as in the above-mentioned Patent Document 1, as shown in FIG. 11, the seat 55 is disposed on the incidence surface of the semiconductor 52 in a portion where the connection of the common electrode 53 to the lead wire 54 is located, the seat 55 making the connection portion alone thicker than the other portions. This causes problems such as heat-deformation stress and radiation attenuation. These problems such as heat-deformation stress and radiation attenuation can be solved by forming the resin layer 57, as in Patent Document 2 noted above, and as shown in FIG. 12, thinner inside the radiation detection effective area SA and thicker outside the radiation detection effective area SA. However, the construction as in Patent Document 2 is complicated and troublesome because the thickness of the resin layer 57 has to be changed depending on inside or outside of the radiation detection effective area SA and the auxiliary plate 56 has to be divided.

This invention has been made having regard to the state of the art noted above, and its object is to provide a radiation detector that can avoid a performance degradation resulting from a lead wire being connected to a common electrode, and further can avoid problems of heat-deformation stress and radiation attenuation.

Means for Solving the Problem

To fulfill the above object, this invention provides the following construction.

A radiation detector of this invention is a radiation detector for detecting radiation, having a radiation sensitive semiconductor for generating electric charges upon incidence of the radiation, a common electrode for bias voltage application formed planarly on an incidence surface of the semiconductor, and a lead wire for bias voltage supply connected to an incidence surface of the common electrode, wherein a portion of the semiconductor, located in said connection of the common electrode to the lead wire, is dented in a recessed form from other portions of the semiconductor, in a range short of a radiation detection effective area; an insulating seat is disposed to fill the portion located in the connection; the common electrode is formed to cover at least part of said seat; and the lead wire is connected to a portion of the incidence surface of the common electrode located on the seat.

According to the radiation detector of this invention, a portion of the (radiation sensitive) semiconductor, located in the connection of the common electrode (for bias voltage application) to the lead wire (for bias voltage supply), is dented in a recessed form from other portions of the semiconductor, in a range short of a radiation detection effective area, and an insulating seat is disposed to fill the portion located in the connection. The common electrode is formed to cover at least part of the above seat, and the lead wire is connected to a portion of the incidence surface of the common electrode located on the seat.

By forming the lead wire to be connected to the portion of the incidence surface of the common electrode located on the seat and disposing the seat to fill the above portion located in the connection (i.e. the portion of the semiconductor dented in a recessed form), the seat reduces the shock occurring when the lead wire is connected to the common electrode. This consequently can prevent damage to the radiation sensitive semiconductor that leads to a voltage resisting defect, and can avoid performance degradation such as voltage resisting defect.

Further, the seat is disposed to fill the portion located in the connection and the common electrode is formed to cover at least part of the seat. Therefore, on the surface reverse to the incidence surface of the common electrode, the seat is present in the portion located in the connection, while the semiconductor is present as embedded by the seat in the other portion. As a result, the thickness of the seat and the common electrode in the connection is substantially the same as that of the semiconductor and the common electrode in the other position, thereby avoiding the problems of heat deformation stress and radiation attenuation.

It is thus possible to avoid the performance degradation resulting from connecting the lead wire to the common electrode, and to avoid the problems of heat deformation stress and radiation attenuation.

In order to prevent creeping discharge, the common electrode preferably is formed as much inwardly as possible of the semiconductor in a range short of the radiation detection effective area. On the other hand, in this invention, it is necessary to dent the above portion of the semiconductor, located in the connection, in a recessed form from other portions of the semiconductor, in a range short of the radiation detection effective area. Therefore, in order to connect the lead wire to the incidence surface of the common electrode, to the portion of the incident surface of the common electrode located on the seat, the seat exists at least in the portion located in the connection, on the surface reverse to the incidence surface of the common electrode. Therefore, the common electrode is to be formed outside the semiconductor at least in the portion located at the connection. Where the common electrode is formed inwardly of the semiconductor as described above, in the range not reaching the radiation detection effective area, the above connection portion preferably is formed to protrude from the other part of the common electrode. By forming the connection portion to protrude from the other part of the common electrode, the common electrode is formed outside the semiconductor.

In one embodiment of this invention as described above, an active matrix substrate is provided having a plurality of collecting electrodes formed on an incidence surface thereof in a one-dimensional or two-dimensional arrangement set inside the above radiation detection effective area, and an electric circuit for storing and reading electric charges collected by the respective collecting electrodes, the semiconductor being laid on incidence surfaces of the collecting electrodes of the active matrix substrate.

In time of radiation detection by the radiation detector in one embodiment of this invention, a bias voltage is applied to the common electrode (for bias voltage application) via the lead wire (for bias voltage supply). With the bias voltage applied, electric charges are generated by the (radiation sensitive) semiconductor upon incidence of the radiation. The generated electric charges are first collected by the collecting electrodes. The electric charges collected by the collecting electrodes are fetched as radiation detection signals from the respective collecting electrodes by the storing and reading electric circuit. By fetching the radiation detection signals, it becomes possible to create a radiographic image according to a one-dimensional intensity distribution or a two-dimensional intensity distribution of the radiation projected to the radiation detection effective area. That is, the radiation detector in one embodiment of this invention is a one-dimensional or two-dimensional array type radiation detector for detecting a one-dimensional or two-dimensional intensity distribution of the radiation projected to the radiation detection effective area.

In the case of the radiation detector in one embodiment of this invention, in other words, the radiation detector having the active matrix substrate, it is preferable to fix an insulating auxiliary plate by a curable synthetic resin so that the semiconductor and common electrode are covered by the auxiliary plate having a thermal expansion coefficient similar to that of the active matrix substrate. With this construction, it is possible to prevent a dielectric breakdown due to warping, cracking and the like caused by quality changes or temperature changes of the semiconductor. The "insulating auxiliary plate having a thermal expansion coefficient similar to that of the active matrix substrate" here refers to a thermal expansion coefficient having substantially the same digits. For example, a thermal expansion coefficient $4.0 \times 10^{-6}/°$ C. refers to a range of $1.0 \times 10^{-6}$ to $1.0 \times 10^{-5}/°$ C.

When constructed in this way, the above-noted curable synthetic resin preferably is formed such that the curable synthetic resin has a film thickness thinner inside the radiation detection effective area than outside the radiation detection effective area including said portion of the common electrode where said lead wire is connected. With the curable synthetic resin formed in this way, the stress on the semiconductor caused by the resin layer of curable synthetic resin can be reduced inside the radiation detection effective area, and the performance degradation in creeping discharge prevention of the resin layer can be suppressed outside the radiation detection effective area.

Further, in the above invention, the semiconductor preferably is one of an amorphous semiconductor of amorphous selenium (a-Se), selenium or selenium compound doped with an alkali metal such as Na, a halogen such as Cl, As or Te, and a non-selenium base polycrystalline semiconductor such as CdTe, CdZnTe, $PbI_2$, $HgI_2$, TlBr. The amorphous semiconductor of amorphous selenium, selenium or selenium compound doped with an alkali metal, a halogen, As or Te, and the non-selenium base polycrystalline semiconductor, have excellent aptitude for large area and large film thickness. On the other hand, these have a Mohs hardness of 4 or less, and thus are soft and vulnerable to damage. However, the seat can reduce the shock occurring when the lead wire is connected to the common electrode, thereby protecting the semiconductor from damage. This facilitates forming the (radiation sensitive) semiconductor with increased area and thickness.

Further, in this invention described above, the seat preferably is formed of a hard resin material such as epoxy resin, polyurethane resin, or acrylic resin. The seat formed of a hard resin material (curable to a high degree of hardness), such as epoxy resin, polyurethane resin or acrylic resin, does not easily contract, and has an excellent buffer function, compared with one formed of a soft polymer material such as silicone resin or synthetic rubber. Thus, the seat can fully reduce the shock occurring when the lead wire is connected to the common electrode.

Further, in this invention described above, the seat preferably has a thickness similar to that of the semiconductor. As described above, since the seat is disposed to embed the portion located in the connection of the common electrode to the lead wire and the common electrode is formed to cover at least part of the seat, the thickness of the seat and the common electrode in the portion located in the connection is substantially the same as that of the semiconductor and the common electrode in the other portion. In order to ensure this, the seat is formed to have a thickness substantially the same as that of the semiconductor. "The seat has a thickness substantially the same as that of the semiconductor" here refers to the thickness of the seat in a range of (1±0.5) times as thick as the semiconductor, and preferably (1±0.2) times to 1 times as thick as the semiconductor.

Further, in this invention described above, it is preferable to use an insulating resin material to fill a gap between the portion, dented in a recess form, of the semiconductor and the seat. When the seat is disposed to embed the portion located in the connection, a gap (step) may be formed by the difference in thickness between the portion of the semiconductor dented in a recess form and the seat. An insulating resin material is used to fill the gap to increase continuity between the portion of the semiconductor dented in a recess form and the seat. This realizes a radiation detector with excellent stability. When an insulating resin material is used to fill the gap, one of epoxy resin, polyurethane resin, acrylic resin, silicone resin and synthetic rubber is used as the insulating resin material.

In another embodiment of this invention described above, a collimator is provided for preventing the radiation incident on said radiation detection effective area from impinging on edges of the common electrode including the portion where the lead wire is connected, and the seat. Electric fields formed by application of the bias voltage concentrate on the edges of the common electrode and the seat. When the radiation impinges there, contingent strong currents could flow, that would cause a failure of the radiation detector. Therefore, a collimator is provided to prevent the radiation from impinging on the edges of the common electrode and the seat. This provision can prevent contingent strong currents that would cause a failure of the radiation detector, from flowing due to the radiation impinging on the edges of the common electrode and the seat where electric fields concentrate.

Effects of the Invention

With the radiation detector according to this invention, the portion of the (radiation sensitive) semiconductor, located in the connection of the common electrode (for bias voltage application) to the lead wire (for bias voltage supply), is dented in a recessed form from other portions of the semiconductor, in a range short of the radiation detection effective area, and an insulating seat is disposed to fill the portion located in the connection. The common electrode is formed to cover at least part of the above seat, and the lead wire is connected to a portion of the incidence surface of the common electrode located on the seat. Thus, the performance degradation resulting from connecting the lead wire to the common electrode and the problems of heat-deformation stress and radiation attenuation can be avoided.

BRIEF DESCRIPTION OF THE DRAWINGS

FIG. 6 (*b*) is a schematic sectional view of the portion when the gap is filled with an insulating resin material;

DESCRIPTION OF REFERENCES

Figure 1:
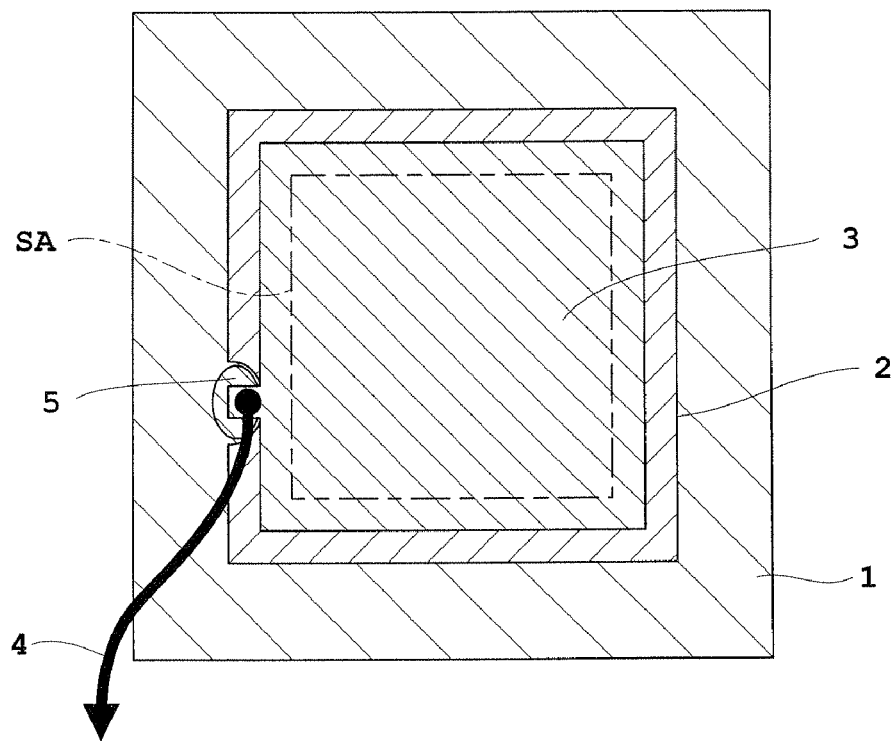
FIG. 1 is a schematic plan view of a direct conversion type flat panel X-ray detector (FPD) in Embodiment 1.

1 . . . active matrix substrate
2 . . . (radiation sensitive) semiconductor
3 . . . common electrode (for bias voltage application)
4 . . . lead wire (for bias voltage supply)

5 . . . (insulating) seat
6 . . . (insulating) auxiliary plate
7 . . . resin film
9 . . . collimator
11 . . . collecting electrodes
12 . . . storing and reading electric circuit
SA . . . radiation detection effective area

BEST MODE FOR CARRYING OUT THE INVENTION

A portion of a radiation sensitive semiconductor, located in a connection of a common electrode for bias voltage application to a lead wire for bias voltage supply, is dented in a recessed form from other portions of the semiconductor, in a range short of the radiation detection effective area, and an insulating seat is disposed to fill the portion located in the connection. The common electrode is formed to cover at least part of the above seat, and the lead wire is connected to a portion of the incidence surface of the common electrode located on the seat. This construction achieves the object of avoiding the performance degradation resulting from connecting the lead wire to the common electrode and avoiding the problems of heat-deformation stress and radiation attenuation.

Embodiment 1

Figure 2:
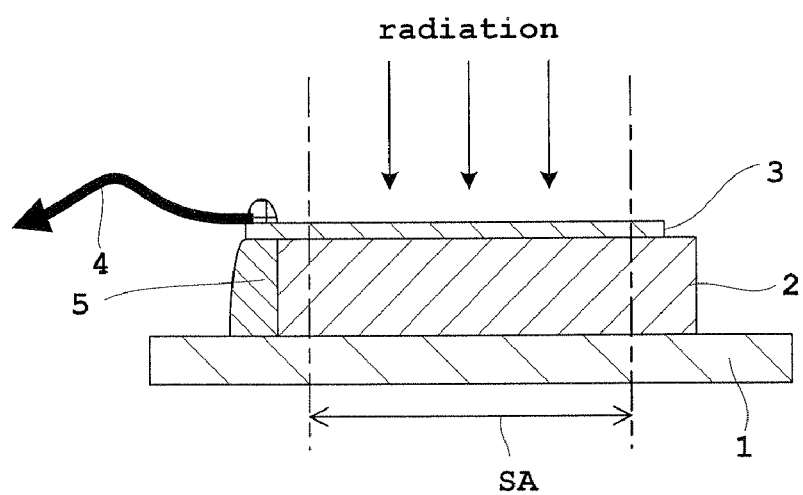
FIG. 2 is a schematic sectional view of the flat panel X-ray detector (FPD) in Embodiment 1.
Figure 3:
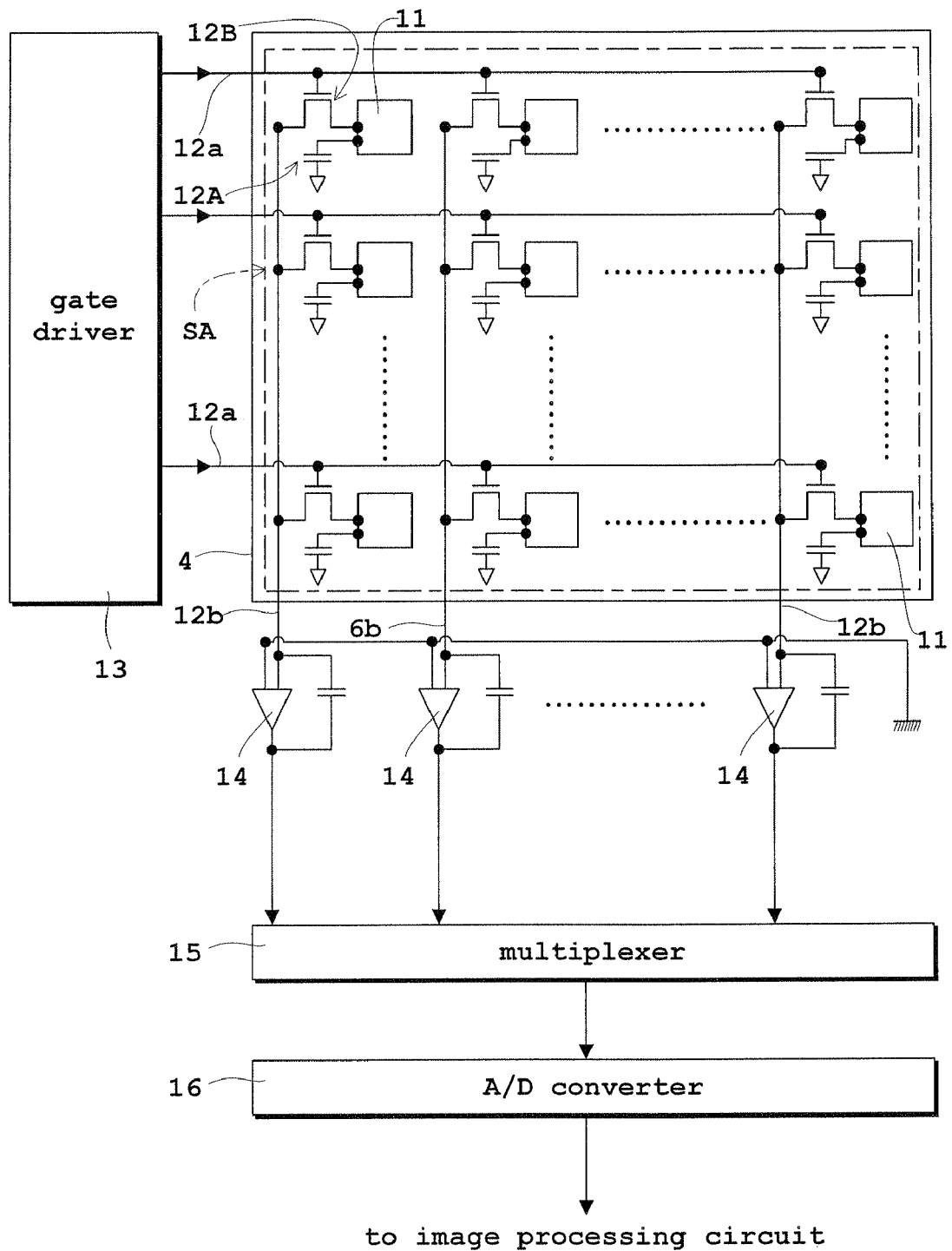
FIG. 3 is a block diagram showing an equivalent circuit of an active matrix substrate of the flat panel X-ray detector (FPD)
Figure 4:
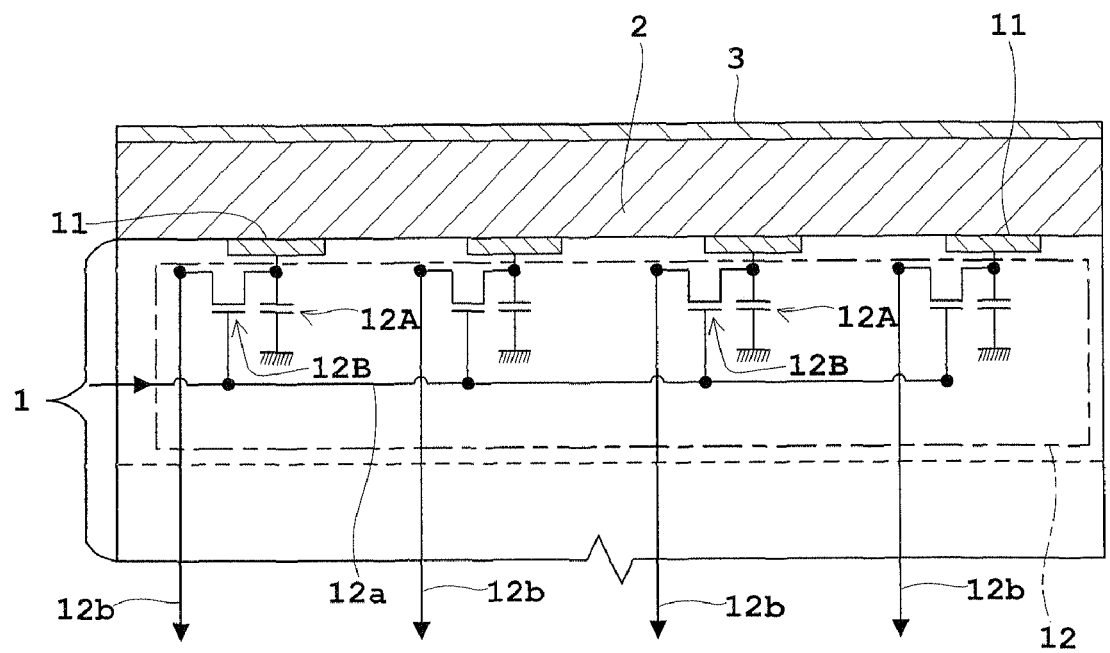
FIG. 4 is a schematic sectional view of the active matrix substrate of the flat panel X-ray detector (FPD)
Figure 5:
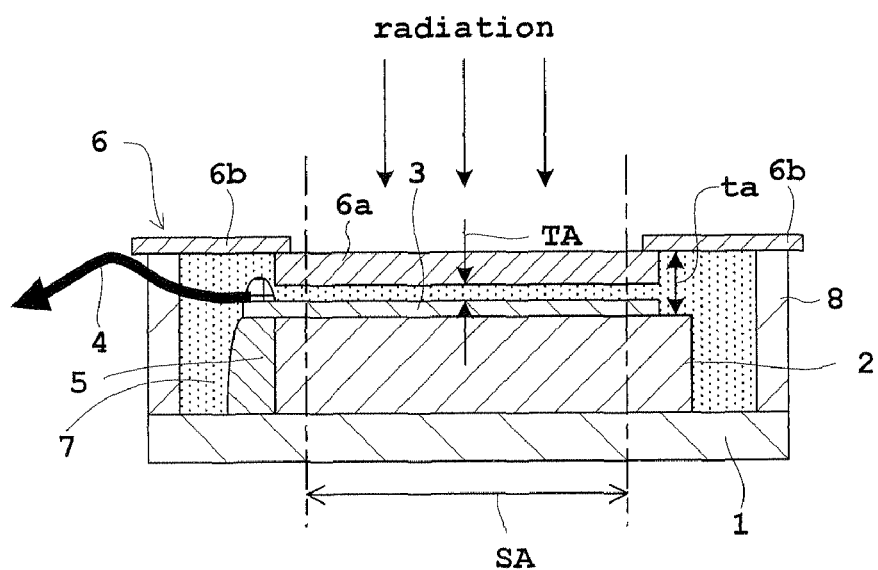
FIG. 5 is a schematic sectional view of the flat panel X-ray detector (FPD) protected by an auxiliary plate in Embodiment 1.

Embodiment 1 of this invention will be described hereinafter with reference to the drawings. FIG. 1 is a schematic plan view of a direct conversion type flat panel X-ray detector (hereinafter abbreviated as "FPD" where appropriate) in Embodiment 1. FIG. 2 is a schematic sectional view of the flat panel X-ray detector (FPD) in Embodiment 1. FIG. 3 is a block diagram showing an equivalent circuit of an active matrix substrate of the flat panel X-ray detector (FPD). FIG. 4 is a schematic sectional view of the active matrix substrate of the flat panel X-ray detector (FPD). FIG. 5 is a schematic sectional view of the flat panel X-ray detector (FPD) protected by an auxiliary plate in Embodiment 1. The flat panel X-ray detector (FPD) will be described as an example of radiation detector in Embodiment 1 and in Embodiment 2 to follow.

As shown in FIGS. 1 and 2, the FPD in Embodiment 1 includes an active matrix substrate 1, a radiation sensitive semiconductor 2 for generating electric charges upon incidence of radiation (X rays in Embodiments 1 and 2), and a common electrode 3 for bias voltage application. As shown in FIGS. 3 and 4, the active matrix substrate 1 has a plurality of collecting electrodes 11 formed on a radiation incidence surface thereof, and an electric circuit 12 for storing and reading electric charges collected by the respective collecting electrodes 11. The respective collecting electrodes 11 are set in a two-dimensional matrix arrangement inside a radiation detection effective area SA. The active matrix substrate 1 corresponds to the active matrix substrate in this invention. The radiation sensitive semiconductor 2 corresponds to the radiation sensitive semiconductor in this invention. The common electrode 3 for bias voltage application corresponds to the common electrode for bias voltage application in this invention. The radiation detection effective area SA corresponds to the radiation detection effective area in this invention.

As shown in FIG. 1, the semiconductor 2 is laid on the incidence surfaces of the collecting electrodes 11 formed on the active matrix substrate 1, and the common electrode 3 is planarly formed and laid on an incidence surface of the semiconductor 2. Further, a lead wire 4 for bias voltage supply is connected to the incidence surface of the common electrode 3. The lead wire 4 such as a copper wire is connected to the common electrode 3 via conductive paste (e.g. silver paste). The lead wire 4 for bias voltage supply corresponds to the lead wire for bias voltage supply in this invention.

As shown in FIGS. 3 and 4, and, as described above, the active matrix substrate 1 has the collecting electrodes 11 formed thereon, and the storing and reading electric circuit 12 arranged therein. The storing and reading electric circuit 12 includes capacitors 12A, TFTs (thin film field effect transistors) 12B acting as switching elements, gate lines 12a and data lines 12b. One capacitor 12A and one TFT 12B are correspondingly connected to each of the collecting electrodes 11. The collecting electrodes 11 correspond to the collecting electrodes in this invention. The storing and reading electric circuit 12 corresponds to the storing and reading electric circuit in this invention.

Further, a gate driver 13, charge-to-voltage converting amplifiers 14, a multiplexer 15 and an analog-to-digital converter 16 are arranged around and connected to the storing and reading electric circuit 12 of the active matrix substrate 1. These gate driver 13, charge-to-voltage converting amplifiers 14, multiplexer 15 and analog-to-digital converter 16 are connected via a substrate different from the active matrix substrate 1. Some or all of these gate driver 13, charge-to-voltage converting amplifiers 14, multiplexer 15 and analog-to-digital converter 16 may be built into the active matrix substrate 1.

In time of X-ray detection by the FPD, a bias voltage from a bias voltage source (not shown) is applied to the common electrode 3 for bias voltage application via the lead wire 4 for bias voltage supply. With the bias voltage applied, electric charges are generated in the radiation sensitive semiconductor 2 upon incidence of the radiation (X rays in Embodiments 1 and 2). The generated electric charges are first collected by the collecting electrodes 11. The collected electric charges are fetched by the storing and reading electric circuit 12 as radiation detection signals (X-ray detection signals in Embodiments 1 and 2) from the respective collecting electrodes 11.

Specifically, the electric charges collected by the collecting electrodes 11 are first stored in the capacitors 12A. Then, the gate driver 13 successively applies read signals via the gate lines 12a to the gates of the respective TFTs 12B. With the read signals applied, the TFTs 12B receiving the read signals are switched from off to on-state. As the data lines 12b connected to the sources of the switched TFTs 12B are successively switched on by the multiplexer 15, the electric charges stored in the capacitors 12A are read from the TFTs 12B through the data lines 12b. The electric charges read are amplified by the charge-to-voltage converting amplifiers 14 and transmitted from the multiplexer 15, as radiation detection signals (X-ray detection signals in Embodiments 1 and 2) from the respective collecting electrodes 11, to the analog-digital converter 16 for conversion analog values to digital values.

Where the FPD is provided for a fluoroscopic apparatus, for example, X ray detection signals are transmitted to an image processing circuit, disposed at a subsequent stage, for image processing to output a two-dimensional fluoroscopic image or the like. Each of the collecting electrodes 11 in the two-dimensional matrix arrangement corresponds to an electrode (pixel electrode) corresponding to each pixel in the radiographic image (two-dimensional fluoroscopic image here). By fetching the radiation detection signals (X-ray detection signals in Embodiments 1 and 2), it becomes possible to create a radiographic image (two-dimensional fluoroscopic image here) according to a two-dimensional intensity distribution of the radiation projected to the radiation detection effective area SA. In other words, the FPD in Embodiment 1, and in Embodiment 2 to follow, is a two-dimensional array type radiation detector for detecting a two-dimensional intensity distribution of radiation (X rays in Embodiments 1 and 2) projected to the radiation detection effective area SA.

Next, each component of the FPD will be described more concretely. As shown in FIGS. 1 and 2, a portion of the semiconductor 2 located in the connection of the common electrode 3 to the lead wire 4 is dented to form a recess from the other portion of the semiconductor 2, in a range not reaching the radiation detection effective area SA. An insulating seat 5 is disposed to fill the portion located in the connection. The common electrode 3 is formed to cover part of the seat 5 and the lead wire 4 is formed for connection to a portion of the incidence surface of the common electrode 3 located on the seat 5. The insulating seat 5 corresponds to the insulating seat in this invention.

By forming the lead wire 4 to be connected to the portion of the incidence surface of the common electrode 3 located on the seat 5 and by disposing the seat 5 to fill the portion located in the connection as noted above (i.e. the portion of the semiconductor 2 dented in the recessed form), the seat 5 can reduce the shock occurring when the lead wire 4 is connected to the common electrode 3. This consequently prevents damage to the radiation sensitive semiconductor 2 that leads to a voltage resisting defect, and avoids performance degradation such as voltage resisting defect.

The seat 5 is disposed to fill the portion located in the connection and the common electrode 3 is formed to cover part of the seat 5. Therefore, on the surface reverse to the incidence surface of the common electrode 3, the seat 5 is present in the connection while the semiconductor is present as embedded by the seat 5 in the other portion. As a result, the thickness of the seat 5 and the common electrode 3 in the connection is substantially the same as that of the semiconductor 2 and the common electrode 3 in the other position, thereby avoiding the problems of heat deformation stress and radiation attenuation.

It is thus possible to avoid the performance degradation resulting from connecting the lead wire 4 to the common electrode 3, and to avoid the problems of heat deformation stress and radiation attenuation. Although the common electrode 3 is formed to cover part of the seat 5, the common electrode 3 may be formed to cover the whole seat 5. That is, the common electrode 3 may be formed to cover at least part of the seat 5.

In order to prevent creeping discharge, the common electrode 3 in Embodiment 1, and also in Embodiment 2 to follow, is formed inwardly of the semiconductor 2 in a range not reaching the radiation detection effective area SA, as shown in FIG. 1. On the other hand, it is necessary to form the above-mentioned portion of the semiconductor 2, located in the connection, in a recessed form dented from the other portion of the semiconductor 2, in the range not reaching the radiation detection effective area SA. In order to connect the lead wire 4 to the common electrode 3, to the portion of the incident surface of the common electrode 3 located on the seat 5, the seat 5 exists at least in the portion located in the connection, on the surface reverse to the incidence surface of the common electrode 3, as shown in FIG. 2. Therefore, the common electrode 3 is to be formed outside the semiconductor 2 at least in the portion located at the connection. Where the common electrode 3 is formed inwardly of the semiconductor 2 as described above, in the range not reaching the radiation detection effective area SA, the above connection portion is formed to protrude from the other part of the common electrode 3. By forming the connection portion to protrude from the other part of the common electrode 3, the common electrode 3 is formed outside the semiconductor 2.

Further, in Embodiment 1, the FPD is protected by an insulating auxiliary plate 6 as shown in FIG. 5. Where the FPD has the active matrix substrate 1 as in Embodiment 1, it is preferable that a resin film 7 made of curable synthetic resin is formed to fix the auxiliary plate 6 so that the insulating auxiliary plate 6 having a thermal expansion coefficient similar to that of the active matrix substrate 1 covers the semiconductor 2 and the common electrode 3.

With this fixing construction, it is possible to prevent a dielectric breakdown due to warping, cracking and the like caused by quality changes or temperature changes of the semiconductor 2. While a glass substrate, for example, is used for the active matrix substrate 1, a Pyrex (registered trademark) glass substrate or a quartz glass substrate, for example, is used for the insulating auxiliary plate 6. The thickness of the glass substrate for the active matrix substrate 1 and the glass substrate for the auxiliary plate 6 are about 0.5 mm to 1.5 mm, for example. "The insulating auxiliary plate 6 having a thermal expansion coefficient substantially the same as that of active matrix substrate" here refers to a thermal expansion coefficient having substantially the same digits. For example, a thermal expansion coefficient $4.0 \times 10^{-6}/^\circ$ C. refers to a range of $1.0 \times 10^{-6}$ to $1.0 \times 10^{-5}/^\circ$ C. The insulating auxiliary plate 6 corresponds to the insulating auxiliary plate in this invention.

When constructed in this way, as shown in FIG. 5, the above-noted resin film 7 preferably is formed to be thinner inside the radiation detection effective area SA than outside the radiation detection effective area SA including the connection of the common electrode 3 to the lead wire 4. Specifically, a frame-like spacer 8 formed of ABS resin or the like is erected around the active matrix substrate 1 to support the auxiliary plate 6 on the incidence side of the spacer 8. An ambient-temperature curable resin composition in liquid form is filled to cure between the active matrix substrate 1 and the auxiliary plate 6. The ambient-temperature curable resin composition after curing forms the resin film 7. Thus, the auxiliary plate 6 is fixed by the resin film 7 formed of the curable synthetic resin. An ambient-temperature curable epoxy resin, for example, is used as an appropriate resin material.

A division is made between a region excluding the periphery and including the radiation detection effective area SA, and a region of the periphery. The auxiliary plate 6 is also divided into two pieces 6a and 6b corresponding to the respective regions. As shown in FIG. 5, the auxiliary plate 6 has the piece 6a for thin film provided for the area including the radiation detection effective area SA, and a piece 6b for thick film provided for the peripheral region, thus creating a gap in the thickness direction between the two pieces 6a and 6b.

Thus, when the auxiliary plate 6 is supported by the spacer 8 and the ambient-temperature curable resin composition is filled and cured between the active matrix substrate 1 and the auxiliary plate 6, a gap is created in the thickness of the resin film 7 between the piece 6a for thin film and the piece 6b for thick film. Consequently, the resin film 7 is formed to be thinner inside the radiation detection effective area SA than outside the radiation detection effective area SA including the above-noted connection. The auxiliary plate 6 may be formed of two separate pieces 6a and 6b, or by integrating the two pieces 6a and 6b.

Inside the radiation detection effective area SA, the resin film 7 is formed thinner so as to reduce stress, resulting from the resin film 7, on the semiconductor 2, while outside the radiation effective area SA, the resin film 7 is formed thicker so as to suppress degradation of performance in creeping discharge prevention.

Where the thickness of the resin film 7 inside the radiation detection effective area SA is TA and the thickness of the resin film 7 outside the radiation detection effective area SA is ta, it is preferable to set the respective thicknesses of the resin film 7 to satisfy $0.5\ ta \geq TA \geq 0.1\ ta$. The thickness TA of the resin film 7 is typically in a range of 0.1 mm to 0.5 mm, and the thickness ta of the resin film 7 is typically in a range of 1 mm to 2 mm.

The thickness of the semiconductor 2 is typically about 0.5 mm to 1.5 mm, and the area is, for example, about 20 cm to 50 cm long by 20 cm to 50 cm wide. The seat 5 preferably has a thickness substantially the same as that of the semiconductor 2. As described above, since the seat 5 is disposed to embed the portion located in the connection of the common electrode 3 to the lead wire 4 and the common electrode 3 is formed to cover at least part of the seat 5, the thickness of the seat 5 and the common electrode 3 in the portion located in the connection is substantially the same as that of the semiconductor 2 and the common electrode 3 in the other portion. In order to ensure this, the seat 5 is formed to have a thickness substantially the same as that of the semiconductor 2. "The seat 5 has a thickness substantially the same as that of the semiconductor 2" here refers to the thickness of the seat 5 in a range of $(1 \pm 0.5)$ times as thick as the semiconductor 2, and preferably $(1 \pm 0.2)$ times to 1 times as thick as the semiconductor 2.

Figure 6:
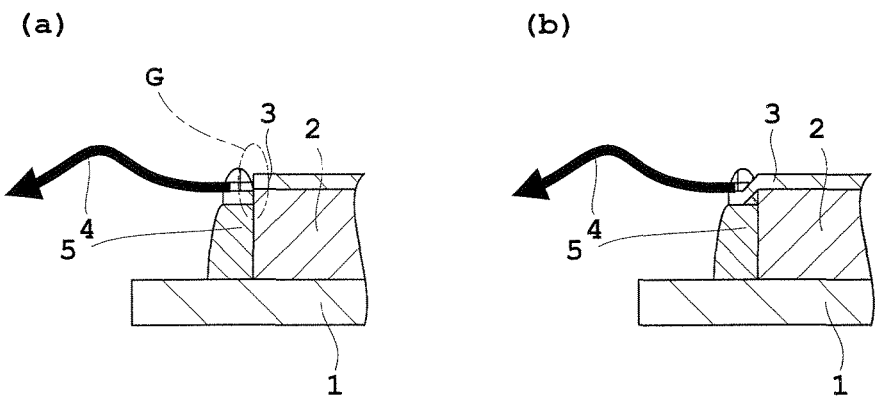
FIG. 6 (*a*) is a schematic sectional view of a portion around a gap.

When the seat 5 is disposed to embed the portion located in the connection, as shown in FIG. 6(a), a gap (step) G may be formed by the difference in thickness between the portion of the semiconductor 2 dented in a recess form and the seat 5. In such a case, as shown in FIG. 6(b), an insulating resin material is used to fill the gap to increase continuity between the portion of the semiconductor 2 dented in a recess form and the seat 5. Thus, FPD with excellent stability can be achieved. When an insulating resin material is used to fill the gap G, one of epoxy resin, polyurethane resin, acrylic resin, silicone resin and synthetic rubber is used as the insulating resin material.

The radiation sensitive semiconductor 2 preferably is one of an amorphous semiconductor of high purity amorphous selenium (a-Se), selenium or selenium compound doped with an alkali metal such as Na, a halogen such as Cl, As or Te, and a non-selenium base polycrystalline semiconductor such as $CdTe$, $CdZnTe$, $PbI_2$, $HgI_2$ or TlBr. An amorphous semiconductor of amorphous selenium, selenium or selenium compound doped with an alkali metal, a halogen, As or Te, and a non-selenium base polycrystalline semiconductor, have excellent aptitude for large area and large film thickness. These have a Mohs hardness of 4 or less, and thus are soft and vulnerable to damage. However, the seat 5 can reduce the shock occurring when the lead wire 4 is connected to the common electrode 3, thereby protecting the semiconductor from damage. This facilitates forming the semiconductor 2 with increased area and thickness. In particular, a-Se with a resistivity of $10^9 \Omega$ or greater, preferably $10^{11} \Omega$ or greater, has an outstanding aptitude for large area and large film thickness when used for the semiconductor 2.

Figure 7:
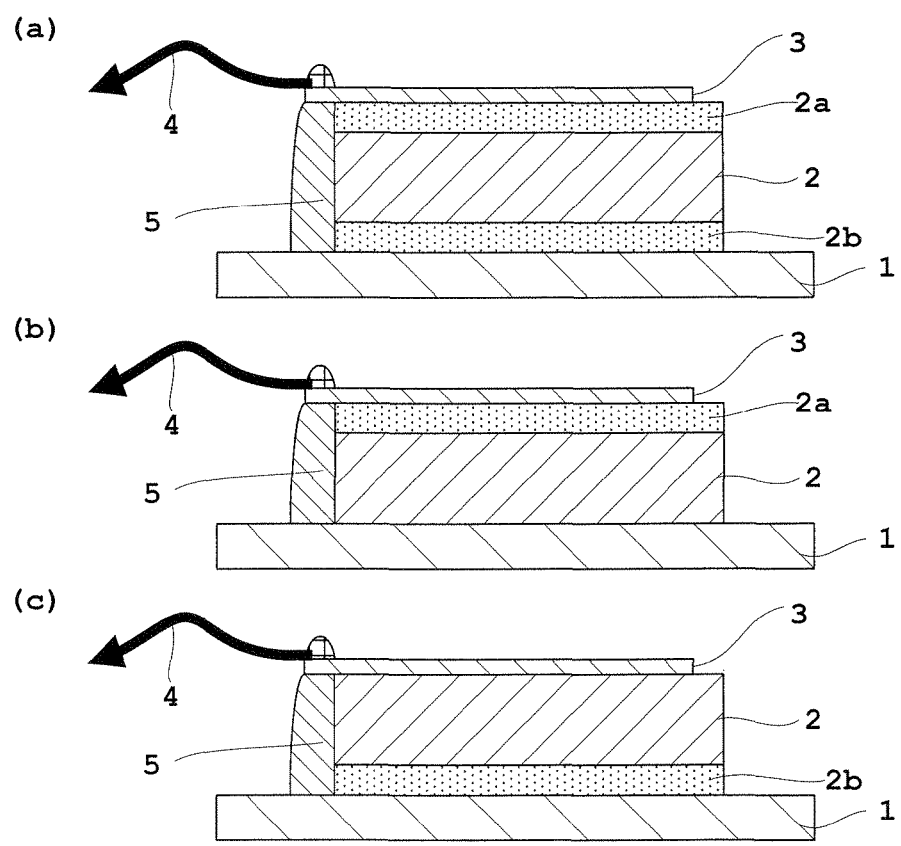
FIGS. 7 (*a*) to (*c*) are schematic sectional views respectively showing combinations of intermediate layers which are carrier selective high resistance semiconductor layers.

In addition to the sensitive semiconductor 2 described above, the semiconductor 2 may be combined with an intermediate layer which is a carrier selective high-resistance semiconductor layer formed on the incidence surface (upper surface in FIG. 2) or the other surface (lower surface in FIG. 2) or both surfaces. As shown in FIG. 7(a), an intermediate layer 2a may be formed between the semiconductor 2 and the common electrode 3, and an intermediate layer 2b may be formed between the semiconductor 2 and the collecting electrodes 11 (see FIG. 4). As shown in FIG. 7(b), the intermediate layer 2a may be formed only between the semiconductor 2 and the common electrode 3. As shown in FIG. 7(c), the intermediate layer 2b may be formed only between the semiconductor 2 and the collecting electrodes 11 (see FIG. 4).

With the carrier selective intermediate layers 2a and 2b disposed as above, dark current can be reduced. The carrier selectivity here refers to a property of being remarkably different in contribution to the charge transfer action between electrons and holes which are charge transfer media (carriers) in a semiconductor.

The semiconductor 2 and the carrier selective intermediate layers 2a and 2b may be combined in the following modes. Where a positive bias voltage is applied to the common electrode 3, the intermediate layer 2a is formed of a material having a large contribution of electrons. This prevents an infiltration of holes from the common electrode 3, thereby reducing dark current. The intermediate layer 2b is formed of a material having a large contribution of holes. This prevents an infiltration of electrons from the collecting electrodes 11, thereby reducing dark current.

Conversely, where a negative bias voltage is applied to the common electrode 3, the intermediate layer 2a is formed of a material having a large contribution of holes. This prevents an infiltration of electrons from the common electrode 3, thereby reducing dark current. The intermediate layer 2b is formed of a material having a large contribution of electrons. This prevents an infiltration of holes from the collecting electrodes 11, thereby reducing dark current.

A preferred thickness of the carrier selective intermediate layers 2a and 2b normally is in a range of 0.1 μm to 10 μm. A thickness of the intermediate layers 2a and 2b less than 0.1 μm tends to be incapable of suppressing dark current sufficiently. Conversely, a thickness exceeding 10 μm tends to obstruct radiation detection (e.g. tends to lower sensitivity).

Semiconductors usable for the carrier selective intermediate layers 2a and 2b and having an excellent aptitude for large area include polycrystalline semiconductors such as $Sb_2S_3$, ZnTe, $CeO_2$, CdS, ZnSe or ZnS, or amorphous semiconductors of selenium or selenium compound doped with an alkali metal such as Na, a halogen such as Cl, As or Te. These semiconductors are thin and vulnerable to scratch. However, the seat 5 can reduce the shock occurring when the lead wire 4 is connected to the common electrode 3, thereby protecting the intermediate layers from damage. This provides the carrier selective intermediate layers 2a and 2b with an excellent aptitude for large area.

Among the semiconductors usable for the intermediate layers 2a and 2b, those having a large contribution of electrons include n-type semiconductors including polycrystalline semiconductors such as $CeO_2$, CdS, CdSe, ZnSe or ZnS, and amorphous materials such as amorphous selenium doped with an alkali metal, As or Te to reduce the contribution of holes.

Those having a large contribution of holes may be p-type semiconductors including polycrystalline semiconductors such as ZnTe, and amorphous materials such as amorphous selenium doped with a halogen to reduce the contribution of electrons.

Further, $Sb_2S_3$, CdTe, CdZnTe, $PbI_2$, $HgI_2$, TlBr, non-doped amorphous selenium or selenium compounds include the type having a large contribution of electrons and the type having a large contribution of holes. Either type may be selected for use as long as film forming conditions are adjusted.

It is preferable to form the insulating seat 5 of a hard resin material such as epoxy resin, polyurethane resin, or acrylic resin. The seat 5 formed of a hard resin material (curable to a high degree of hardness), such as epoxy resin, polyurethane resin or acrylic resin, does not easily contract, and has an excellent buffer function, compared with one formed of a soft material such as silicone resin or synthetic rubber. Thus the seat 5 can fully reduce the shock occurring when the lead wire 4 is connected to the common electrode 3.

Embodiment 2

Figure 8:
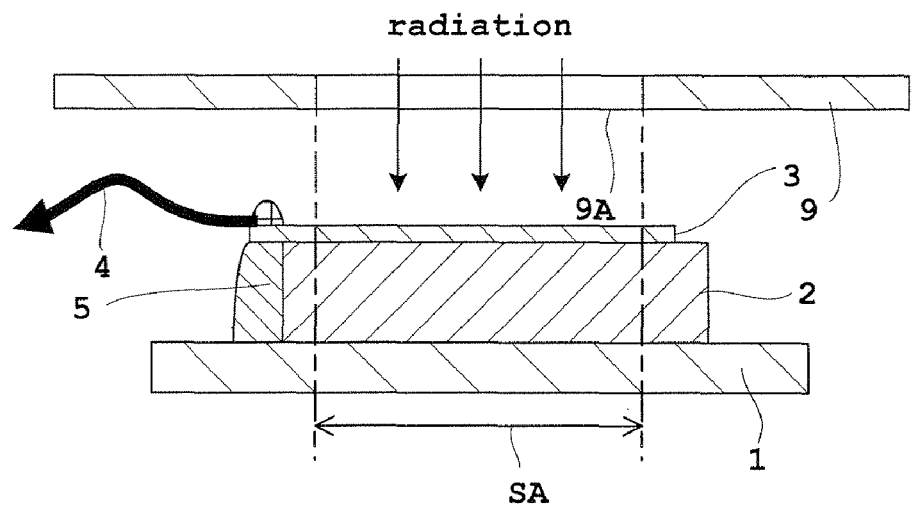
FIG. 8 is a schematic sectional view of a flat-panel X-ray detector (FPD) in Embodiment 2.

Next, Embodiment 2 of this invention will be described with reference to the drawings. FIG. 8 is a schematic sectional view of a flat panel X-ray detector (FPD) in Embodiment 2. Parts in common with foregoing Embodiment 1 are designated by the same reference numbers, and will not be described again, or shown in the drawings.

As shown in FIG. 8, the FPD in Embodiment 2 has a collimator 9 for preventing the radiation (X rays here) incident on the radiation detection effective area SA from impinging on edges of the common electrode 3 including the connection to the lead wire 4, and the seat 5. The collimator 9 corresponds to the collimator in this invention.

Electric fields formed by application of the bias voltage concentrate on the edges of the common electrode 3 and the seat 5. When the radiation impinges there, contingent strong currents could flow, that would cause a failure of the FPD (in particular, breakdown of TFTs 12B of the storing and reading electric circuit 12). Therefore, in Embodiment 2, the collimator 9 is provided to prevent the radiation from impinging on the edges of the common electrode 3 and the seat 5.

Specifically, the collimator 9 has an opening 9A formed so that the radiation may enter the radiation detection effective area SA without impinging on the edges of the common electrode 3 and the seat 5. With the collimator 9 provided as described above, contingent strong currents that would cause a failure of the FPD can be prevented from being produced by the radiation impinging on the edges of the common electrode 3 and the seat 5 where electric fields concentrate.

In Embodiment 2 also, as in Embodiment 1, in addition to the sensitive semiconductor 2 described above, the semiconductor 2 may be combined with an intermediate layer which is a carrier selective high-resistance semiconductor layer formed on the incidence surface or the other surface, or both the sides.

This invention is not limited to the above embodiments, but may be modified as follows:

(1) The radiation detectors, as typified by flat panel X-ray detectors, described in the above embodiments are the two-dimensional array type. The radiation detector according to this invention may be the one-dimensional array type having collecting electrodes formed in a one-dimensional matrix array, or the non-array type having a single electrode for fetching radiation detection signals.

(2) In the above embodiments, the radiation detectors are described taking X-ray detectors for example. However, this invention may be applied to radiation detectors (e.g. gamma ray detectors) for detecting radiation other than X rays (e.g. gamma rays).

(3) Embodiments 1 and 2 described above may be combined. In other words, a detector may be provided which combines the construction described in Embodiment 1 (see FIG. 5) wherein the resin film 7 of curable synthetic resin is formed to fix the insulating auxiliary plate 6 so that the insulating auxiliary plate 6 having a thermal expansion coefficient substantially the same as that of the active matrix substrate 1 covers the semiconductor 2 and the common electrode 3, and the construction described in Embodiment 2 (see FIG. 8) wherein the collimator 9 is provided for preventing the radiation incident on the radiation detection effective area SA from impinging on edges, including the connection to the lead wire 4, of the common electrode 3 and the seat 5.

(4) In each of the above embodiments, the common electrode 3 is formed inwardly of the semiconductor 2 in the range not reaching the radiation detection effective area SA, in order to prevent creeping discharge. When creeping discharge is left out of consideration, the edges of the common electrode 3 and the semiconductor 2 may be placed flush, or the common electrode 3 may be formed outwardly of the semiconductor 2. When the common electrode 3 is not formed inwardly of the semiconductor 2, the portion of the common electrode 3, where the lead wire 4 is connected, is not necessarily protruded, in a boss form, from the other part of the common electrode 3. Even when the common electrode 3 is not formed inwardly of the semiconductor 2, the above connection portion may be protruded, in a boss form, from the other part of the common electrode 3, of course.

(5) In each of the above embodiments, the insulating seat 5 may be formed by filling and curing a hard resin material for the seat 5, such as epoxy resin, polyurethane resin, acrylic resin or the like, in the dented portion of the semiconductor 2. Alternatively, the seat 5 may be formed solid in advance of mounting in the dented portion.

Figure 9:
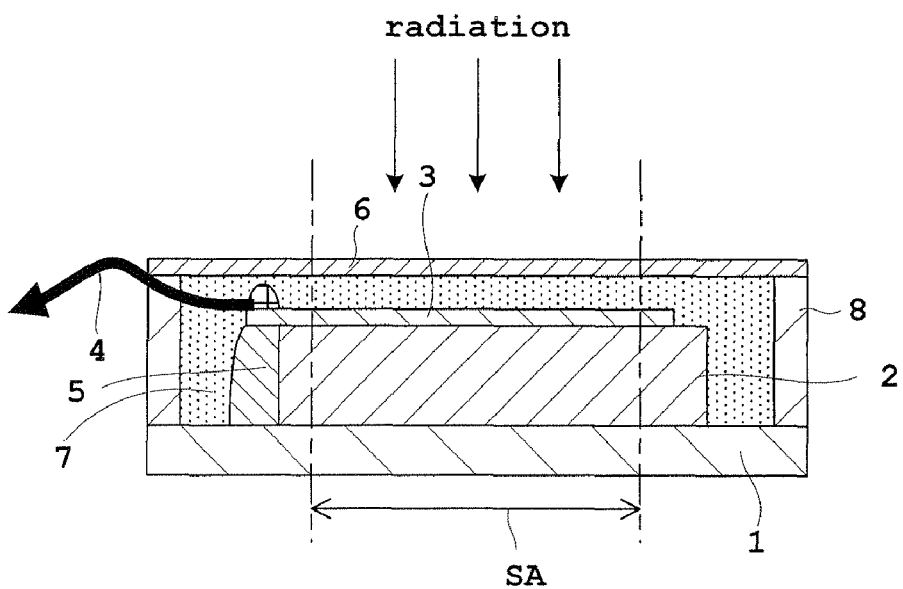
FIG. 9 is a schematic sectional view of a flat-panel X-ray detector (FPD) in a modified form.
Figure 10:
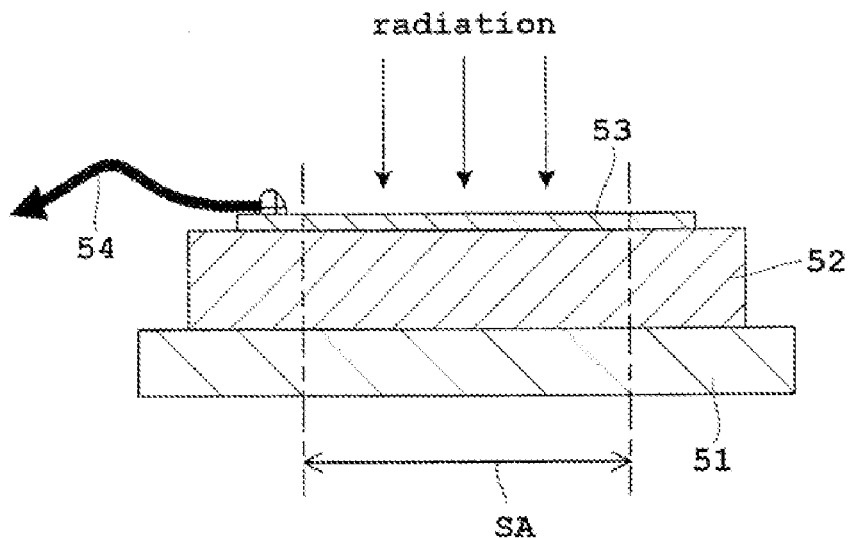
FIG. 10 is a schematic sectional view of a conventional X-ray detector.
Figure 11:
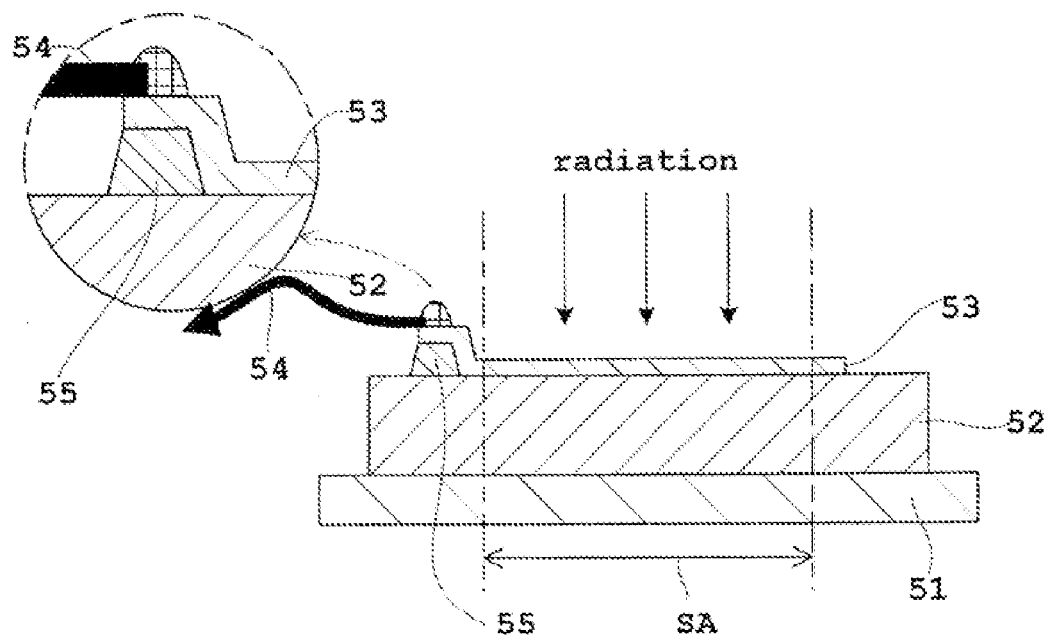
FIG. 11 is a schematic sectional view of a conventional X-ray detector different from what is shown in FIG. 10.
Figure 12:
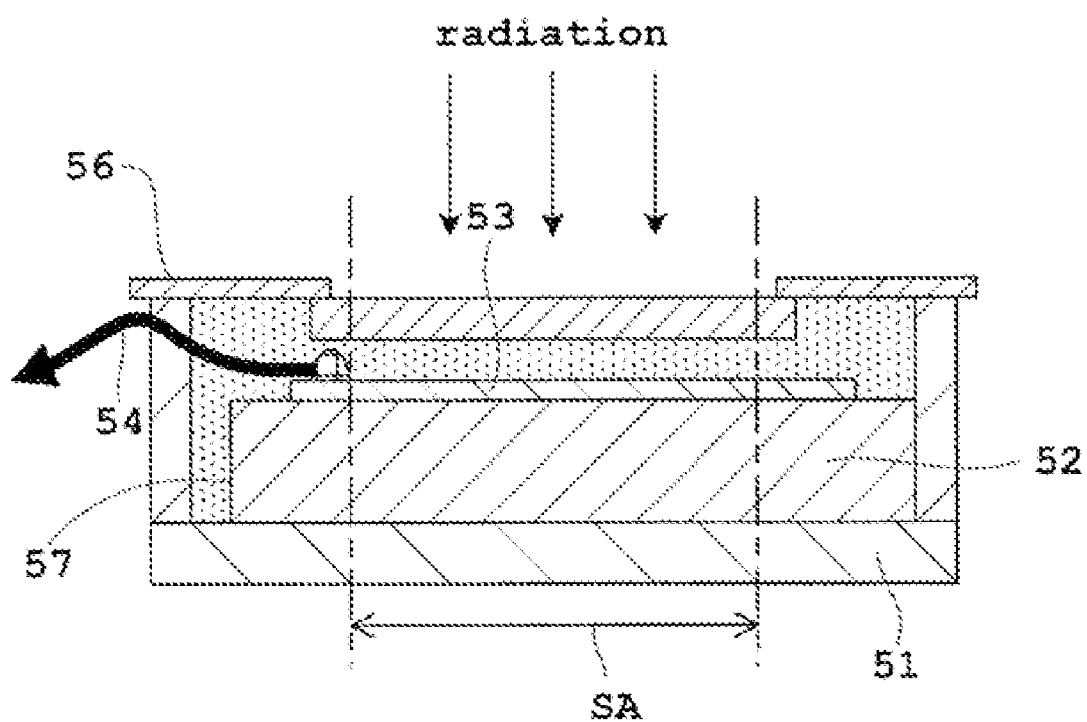
FIG. 12 is a schematic sectional view of a further conventional X-ray detector different from those of FIGS. 10 and 11.

(6) In Embodiment 1 described above, the resin film 7 made of a curable synthetic resin is formed thinner inside the radiation detection effective area SA than outside the radiation detection effective area SA including the connection of the common electrode 3 to the lead wire 4 (see FIG. 5). The resin film 7, however, may be formed to have a uniform thickness throughout the whole area, as shown in FIG. 9.

(7) In Embodiment 1 described above, the resin film 7 made of a curable synthetic resin fixes the auxiliary plate 6 so that the insulating auxiliary plate 6 having a thermal expansion coefficient substantially the same as that of the active matrix substrate 1 covers the semiconductor 2 and the common electrode 3. This resin film 7 is formed by filling and curing an ambient-temperature curable resin composition in liquid form between the active matrix substrate 1 and the auxiliary plate 6. However, the auxiliary plate 6 may be fixed after applying the ambient-temperature curable resin composition to the incidence surface of the common electrode 3. In this case, the spacer 8 as shown in FIG. 5 is not indispensable, and the film may be formed thinner.

INDUSTRIAL UTILITY

As described above, this invention is suitable for direct conversion type flat panel radiation detectors.

The invention claimed is:
1. A radiation detector for detecting radiation, having
a radiation sensitive semiconductor for generating electric charges upon incidence of the radiation,
a common electrode for bias voltage application formed planarly on an incidence surface of the semiconductor, and a lead wire for bias voltage supply connected to an incidence surface of the common electrode, wherein a portion of the semiconductor, located in said connection of the common electrode to the lead wire, is dented in a recessed form from other portions of the semiconductor, in a range short of a radiation detection effective area; an insulating seat is disposed to fill the portion located in the connection; the common electrode is formed to cover at least part of said seat; the lead wire is connected to a portion of the incidence surface of the common electrode located on the seat; and said seat has a thickness similar to that of said semiconductor.

2. The radiation detector as defined in claim 1, wherein said common electrode is formed inwardly of said semiconductor in a range short of said radiation detection effective area.

3. The radiation detector as defined in claim 2, wherein the portion of said common electrode, where said lead wire is connected, is protruded in a boss form from other portions of the common electrode.

4. The radiation detector as defined in claim 1, wherein an active matrix substrate is provided having a plurality of collecting electrodes formed on an incidence surface thereof in a one-dimensional or two-dimensional arrangement set inside said radiation detection effective area, and an electric circuit for storing and reading electric charges collected by the respective collecting electrodes, said semiconductor being laid on incidence surfaces of the collecting electrodes of the active matrix substrate.

5. The radiation detector as defined in claim 4, wherein an insulating auxiliary plate having a thermal expansion coefficient similar to that of said active matrix substrate is fixed by a curable synthetic resin so that said semiconductor and said common electrode are covered by said auxiliary plate.

6. The radiation detector as defined in claim 5, wherein said curable synthetic resin is formed such that said curable synthetic resin has a film thickness thinner inside said radiation detection effective area than outside said radiation detection effective area including said portion of the common electrode where said lead wire is connected.

7. The radiation detector as defined in claim 1, wherein said semiconductor is one of an amorphous semiconductor of amorphous selenium (a-Se), selenium or selenium compound doped with an alkali metal, a halogen, As or Te, and a non-selenium base polycrystalline semiconductor.

8. The radiation detector as defined in claim 7, wherein said alkali metal is sodium (Na).

9. The radiation detector as defined in claim 7, wherein said halogen is chloride (Cl).

10. The radiation detector as defined in claim 7, wherein said non-selenium base polycrystalline semiconductor is one of CdTe, CdZnTe, $PbI_2$, $HgI_2$ and TlBr.

11. The radiation detector as defined in claim 1, wherein said seat is formed of a hard resin material.

12. The radiation detector as defined in claim 11, wherein said hard resin material is one of epoxy resin, polyurethane resin and acrylic resin.

13. The radiation detector as defined in claim 1, wherein a insulating resin material is used to fill a gap between said portion of the semiconductor dented in a recess form and said seat.

14. The radiation detector as defined in claim 13, wherein said insulating resin material is one of epoxy resin, polyurethane resin, acrylic resin silicone resin and synthetic rubber.

15. The radiation detector as defined claim 1, wherein a collimator is provided for preventing the radiation incident on said radiation detection effective area from impinging on edges of the common electrode including said portion where said lead wire is connected, and said seat.

* * * * *